United States Patent
Ra et al.

(10) Patent No.: US 11,067,859 B2
(45) Date of Patent: Jul. 20, 2021

(54) LIQUID CRYSTAL DISPLAY DEVICE AND REPAIRING METHOD THEREOF

(71) Applicant: Samsung Display Co., Ltd., Yongin-Si (KR)

(72) Inventors: Yoo Mi Ra, Ansan-si (KR); Seong Young Lee, Hwaseong-si (KR); Kyung Ho Kim, Seongnam-si (KR); Na Hyeon Cha, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/368,858

(22) Filed: Mar. 29, 2019

(65) Prior Publication Data
US 2020/0064663 A1    Feb. 27, 2020

(30) Foreign Application Priority Data
Aug. 23, 2018  (KR) .................. 10-2018-0098543

(51) Int. Cl.
*G02F 1/1343*    (2006.01)
*G02F 1/1362*    (2006.01)
*G02F 1/13*      (2006.01)

(52) U.S. Cl.
CPC ...... *G02F 1/1343* (2013.01); *G02F 1/136259* (2013.01); *G02F 1/1309* (2013.01)

(58) Field of Classification Search
CPC ... G02F 1/136259; G02F 2001/136263; G02F 2001/136272; G02F 2201/506; G02F 2201/508; G02F 1/1368; G02F 1/136286; G02F 1/136213; H01L 27/1255; G09G 2300/0876
See application file for complete search history.

(56) References Cited

U.S. PATENT DOCUMENTS

| | | | |
|---|---|---|---|
| 6,403,980 B1* | 6/2002 | Park ................ | G02F 1/136213 257/296 |
| 2006/0071212 A1* | 4/2006 | Song ................ | H01L 27/1255 257/59 |
| 2016/0322397 A1* | 11/2016 | Lee ................ | G02F 1/136259 |
| 2016/0334683 A1* | 11/2016 | Song ................ | G02F 1/136227 |

FOREIGN PATENT DOCUMENTS

| | | |
|---|---|---|
| KR | 10-2006-0015207 A | 2/2006 |
| KR | 10-0779013 B1 | 11/2007 |
| KR | 10-2009-0005817 A | 1/2009 |
| KR | 10-0909959 B1 | 7/2009 |
| KR | 10-2016-0060198 A | 5/2016 |

\* cited by examiner

*Primary Examiner* — Angela K Davison
(74) *Attorney, Agent, or Firm* — Innovation Counsel LLP

(57) ABSTRACT

A liquid crystal display device may include a gate line, a data line, a storage electrode set, a transistor, a pixel electrode, and repair member. The gate line may transmit a gate signal. The data line may transmit a data signal. The transistor may include a gate electrode connected to the gate line, a source electrode connected to the data line, and a drain electrode connected to the pixel electrode. The drain electrode and the storage electrode set may overlap each other and form a storage capacitor. The repair member may be formed of an electrically conductive material, may be electrically insulated from each of the drain electrode and the data line, and may overlap the storage electrode set.

21 Claims, 10 Drawing Sheets

LIQUID CRYSTAL DISPLAY DEVICE AND REPAIRING METHOD THEREOF

CROSS-REFERENCE TO RELATED APPLICATION

This application claims priority to and the benefit of Korean Patent Application No. 10-2018-0098543 filed in the Korean Intellectual Property Office on Aug. 23, 2018; the entire contents of the Korean Patent Application are incorporated herein by reference.

BACKGROUND

(a) Technical Field

The technical field relates to a liquid crystal display device and a repairing method of the liquid crystal display device.

(b) Description of the Related Art

A liquid crystal display device may include field generating electrodes and a liquid crystal layer. The liquid crystal display device may apply a voltage to the field generating electrodes to rearrange liquid crystal molecules of the liquid crystal layer, thereby controlling light transmittance of the liquid crystal layer to display a desired image. The liquid crystal display device may include a thin film transistor, a gate line for transmitting a gate signal, a data line for transmitting a data signal, and a common voltage line for transmitting a common voltage signal to each pixel. The data line may cross the common voltage line. In a region where the common voltage line and the data line overlap each other, a short circuit may be formed, such that the common voltage signal and the data signal may be undesirably mixed.

The above information disclosed in this Background section is for enhancement of understanding of the background of this application. This Background section may contain information that does not form the prior art that is already known in this country to a person of ordinary skill in the art.

SUMMARY

Embodiments may be related a liquid crystal display device and a repair method. In the display device and/or the repair method, a common voltage may be desirably applied to a pixel even if a storage electrode line is cut to avoid an unwanted short circuit.

A liquid crystal display according to an exemplary embodiment includes a display panel including a plurality of pixels, a plurality of gate lines, a plurality of pairs of data lines including a plurality of first data lines and second data lines, and a plurality of storage electrode lines, wherein each of the plurality of pixels includes: a first thin film transistor connected to the gate line and one of the first data line or the second data line; a pixel electrode connected to the first thin film transistor; and a repair pattern crossing the gate line, wherein the storage electrode line includes longitudinal parts parallel to a pair of data lines, and the repair pattern overlaps the storage electrode line or one of the longitudinal parts adjacent thereto.

The repair pattern may be parallel to a pair of data lines.

A gate insulating layer disposed on the gate line and the storage electrode line may be further included, and wherein a pair of data lines and the repair pattern may be disposed on the gate insulating layer.

The gate line and the storage electrode line may be disposed on the same layer, and the storage electrode line may further include a transverse part extending to be parallel to the gate line.

One end of the repair pattern may overlap the transverse part, and the other end may overlap an adjacent storage electrode line.

One end of the repair pattern may be connected to the transverse part through a contact hole of the gate insulating layer, and the other end of the repair pattern may be connected to the adjacent storage electrode line.

The repair pattern may cross a pair of data lines, the storage electrode line may include a floating storage electrode crossing a pair of data lines, and the repair pattern may be parallel to the gate line and overlap an adjacent floating storage electrode.

A gate insulating layer disposed on the gate line and the storage electrode line may be further included, and the repair pattern and a pair of data lines may be disposed on the gate insulating layer.

The storage electrode line may be disposed on the same layer as the gate line, and the storage electrode line may further include a transverse part extending parallel to the gate line.

The repair pattern may be connected to the floating storage electrode through a contact hole of the gate insulating layer.

A liquid crystal display according to another exemplary embodiment includes a display panel including a plurality of pixels, a plurality of gate lines, a plurality of pairs of data lines including a plurality of first data lines and second data lines, a plurality of reference voltage lines, and a plurality of storage electrode lines, wherein each of the plurality of pixels includes: a first thin film transistor connected to the gate line and one of the first data line or the second data line; a pixel electrode connected to the first thin film transistor; and a repair pattern crossing the gate line, wherein a pair of data lines and the reference voltage line cross the gate line, wherein the storage electrode line includes longitudinal parts parallel to a pair of data lines, and the repair pattern overlaps the storage electrode line or one of the longitudinal parts adjacent thereto.

The repair pattern maybe disposed to be parallel to a pair of data lines.

A gate insulating layer disposed on the gate line and the storage electrode line may be further included, and a pair of data lines, the reference voltage line, wherein the repair pattern may be disposed on the gate insulating layer.

The gate line and the storage electrode line may be disposed on the same layer, and the storage electrode line may further include a transverse part extending to be parallel to the gate line.

One end of the repair pattern may overlap the transverse part and the other end may overlap an adjacent storage electrode line.

One end of the repair pattern may be connected to the transverse part through a contact hole of the gate insulating layer, and the other end of the repair pattern may be connected to the adjacent storage electrode line.

A third thin film transistor connected to the first thin film transistor and the pixel electrode may be further included.

A repair method of a liquid crystal display including a plurality of gate lines, a plurality of pairs of data lines including a plurality of first data lines and second data lines, a plurality of storage electrode lines including longitudinal parts parallel to a pair of data lines, a first thin film transistor connected to the gate line and one of a pair of data lines, a pixel electrode connected to the first thin film transistor, and a repair pattern crossing the gate line and overlapping the storage electrode line or the storage electrode adjacent thereto, according to an exemplary embodiment, includes: cutting one region of the storage electrode line in a region where the storage electrode line and the first data line or the second data line are overlapped; and irradiating a laser to a region where the repair pattern and the storage electrode line or one of the longitudinal parts adjacent thereto are overlapped to be short-circuited.

The liquid crystal display may further include: a reference voltage line parallel to a pair of data lines; and a third thin film transistor connected to the gate line and one among a pair of data lines or the reference voltage line.

The plurality of storage electrode lines may further include a floating storage electrode crossing a pair of data lines, and the repair pattern crosses a pair of data lines and overlaps the adjacent floating storage electrode, wherein the repair method may further include: cutting one region of the storage electrode line in a region where the storage electrode line and the first data line or the second data line are overlapped; and irradiating a laser to a region where the repair pattern and the adjacent floating storage electrode are overlapped to be short-circuited.

An embodiment may be related to a liquid crystal display device. The liquid crystal display device may include a gate line, a first data line, a first storage electrode set, a first thin film transistor, a first pixel electrode, and first repair member. The gate line may transmit a gate signal. The first data line may cross the gate line and may transmit a first data signal. The first thin film transistor may include a first gate electrode, a first source electrode, a first drain electrode, and a first semiconductor member. The semiconductor member may overlap each of the first gate electrode, the first source electrode, and the first drain electrode. The first gate electrode may be electrically connected to the gate line. The first source electrode may be electrically connected to the first data line. The drain electrode and the first storage electrode set may overlap each other and form a storage capacitor. The first pixel electrode may be electrically connected to the first drain electrode. The first repair member may be formed of an electrically conductive material, may be electrically insulated from each of the first drain electrode and the first data line, and may overlapping the first storage electrode set.

The first repair member may be parallel to the first data line in a plan view of the liquid crystal display device.

The liquid crystal display device may include a gate insulating layer disposed on the gate line and the first storage electrode set. The gate insulating layer may electrically insulate each of the gate line and the first storage electrode set from each of the first data line and the first repair member.

A face of the gate line may be coplanar with a face of the first storage electrode set. The first storage electrode set may include a first storage electrode part extending parallel to the gate line in the plan view of the liquid crystal display device.

The liquid crystal display device may include the following elements: a second pixel electrode immediately neighboring the first pixel electrode with no intervening pixel electrode disposed between the first pixel electrode and the second pixel electrode; and a second storage electrode set overlapping the second pixel electrode. The first end of the first repair member may overlap the first storage electrode part. The second end of the first repair member may overlap the second storage electrode set.

The first end of the first repair member may be (directly and/or electrically) connected to the first storage electrode part through a first contact hole of the gate insulating layer. The second end of the first repair member may be (directly and/or electrically) connected to the second storage electrode set through a second contact hole of the gate insulating layer.

The first storage electrode set may include a floating storage electrode crossing the first data line in a plan view of the liquid crystal display device. The first repair member may be parallel to the gate line in the plan view of the liquid crystal display device and may overlap the floating storage electrode.

The liquid crystal display device may include a gate insulating layer disposed on the gate line and the first storage electrode set. The gate insulating layer may electrically insulate each of the gate line and the first storage set from each of the first repair member and the first data line.

A face of the first storage electrode set may be coplanar with a face of the gate line. The first storage electrode set may include a storage electrode part extending parallel to the gate line in the plan view of the liquid crystal display device.

The first repair member may be connected to the floating storage electrode through a contact hole of the gate insulating layer.

The liquid crystal display device may include a reference voltage line overlapping the first pixel electrode and configured to transmit a reference voltage. The repair member may cross the gate line and may be parallel to a section of the reference voltage line in a plan view of the liquid crystal display device.

The liquid crystal display device may include a second data line configured to transmit a second data signal and immediately neighboring the first data line with no intervening data line being disposed between the first data line and the second data line. The first repair member may be disposed between the first data line and the second data line.

The liquid crystal display device may include a gate insulating layer disposed on the gate line and the first storage electrode set. The gate insulating layer may electrically insulate each of the gate line and the first storage electrode set from each of the first data line, the reference voltage line, and the first repair member.

A face of the gate line may be coplanar with a face of the storage electrode set. The first storage electrode set may include a first storage electrode part extending parallel to the gate line in the plan view of the liquid crystal display device.

The liquid crystal display device may include the following elements: a second pixel electrode immediately neighboring the first pixel electrode with no intervening pixel electrode being disposed between the first pixel electrode and the second pixel electrode; and a second storage electrode set overlapping the second pixel electrode. The first end of the first repair member may overlap the first storage electrode part. The second end of the first repair member may overlap the second storage electrode set.

The first end of the first repair member may be (directly and/or electrically) connected to the first storage electrode part through a first contact hole of the gate insulating layer. The second end of the first repair member may be (directly and/or electrically) connected to the second storage electrode set through a second contact hole of the gate insulating layer.

The liquid crystal display device may include a second thin film transistor electrically connected to each of the reference voltage line, the first thin film transistor, and the first pixel electrode.

An embodiment may be related to a repair method of a liquid crystal display device. The liquid crystal display device may include a gate line, a first data line, a first storage electrode set, a first thin film transistor overlapping the first storage electrode set and electrically connected to each of the gate line and the first data line, a first pixel electrode electrically connected to the first thin film transistor, and a first repair member overlapping the first storage electrode set. The repair method may include the following steps: cutting a first portion of the storage electrode set that overlaps the first data line; and irradiating a first laser to at least one of a first part of the first repair member and a second portion of the first storage electrode set to electrically connect the first part of the first repair member to the second portion of the first storage electrode set.

The repair method may include the following step: irradiating a second laser to at least one of a second part of the first repair member and a portion of a second storage electrode set to electrically connect the second part of the first repair member to the portion of the second storage electrode set. The liquid crystal display device may include the second storage electrode set and a second pixel electrode overlapping the second storage electrode set.

The first storage electrode set may include a floating storage electrode crossing the first data line in a plan view of the liquid crystal display device. The second portion of the first storage electrode set may be a portion of the floating storage electrode.

According to embodiments, by disposing the repair pattern/member connecting the storage electrode lines/sets of adjacent pixels, even if a storage electrode line/set is cut for avoiding an unwanted short circuit, the common voltage may be sufficiently applied to pixels.

In a liquid crystal display device according an embodiment, overlap between a storage electrode line/set and a data line may be minimized. Advantageously, a charge ratio may be improved.

DETAILED DESCRIPTION OF THE EMBODIMENTS

Figure 1:
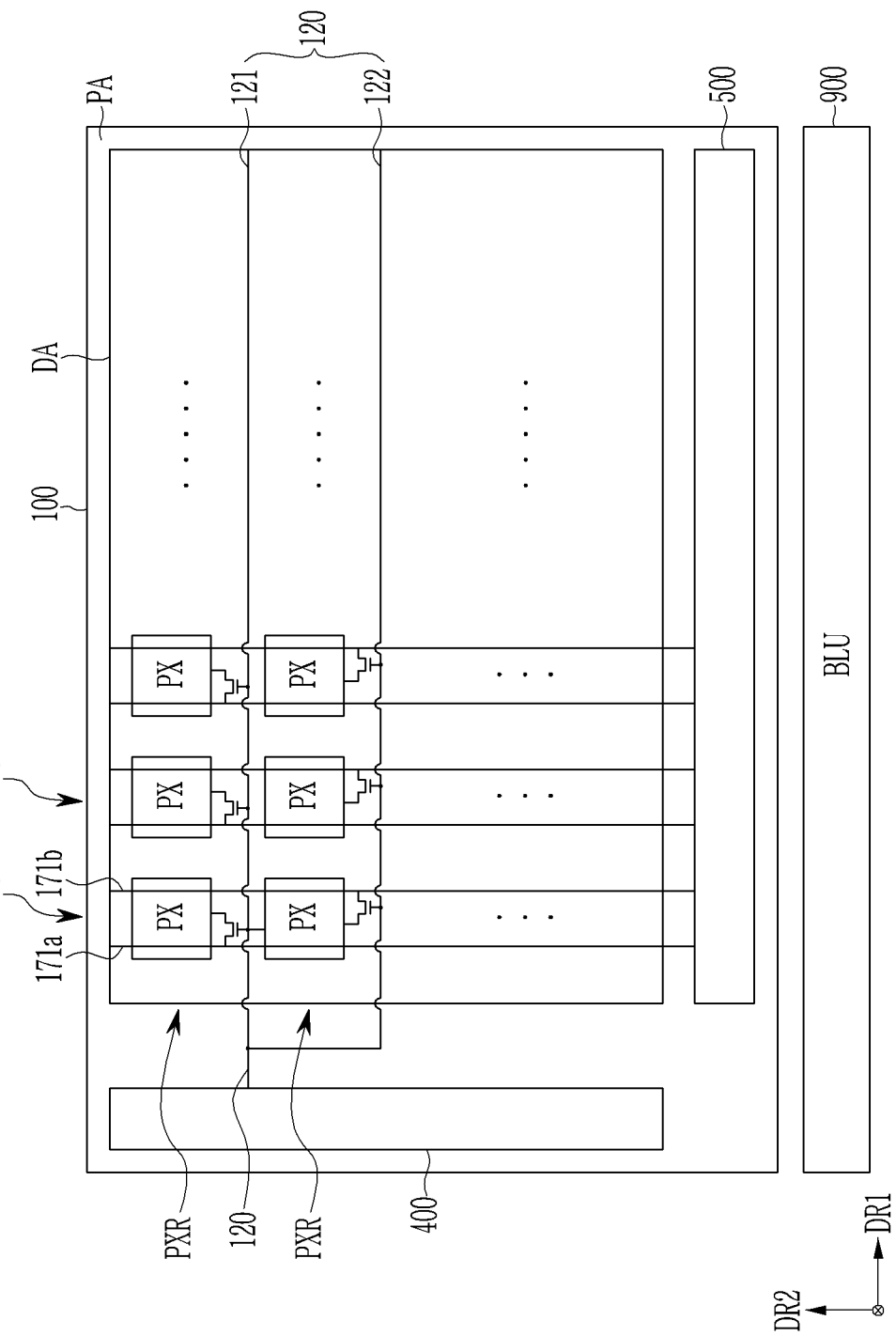
FIG. 1 is a schematic top plan view illustrating a liquid crystal display according to an embodiment.

Example embodiments are described with reference to the accompanying drawings. The described embodiments may be modified in various ways, all without departing from the intended scope.

Same reference numerals may designate the same or similar elements.

In the drawings, thicknesses of layers, films, panels, regions, etc. may be exaggerated for clarity.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "on" a second element, the first element can be directly on the second element, or one or more intervening elements may be present between the first element and the second element. When a first element is referred to as being "directly on" a second element, there are no intended intervening elements (except environmental elements such as air) present between the first element and the second element. The word "on" or "above" may mean positioned on or below the object portion, and does not necessarily mean positioned on the upper side of the object portion based on a gravitational direction.

Unless explicitly described to the contrary, the word "comprise" and variations such as "comprises" or "comprising" may imply the inclusion of stated elements but not the exclusion of any other elements.

The term "liquid crystal display" may mean "liquid crystal display device"; the term "connect" may mean "electrically connect" and/or "directly connect"; the term "insulate" may mean "electrically insulate"; the term "conductive" may mean "electrically conductive"; the term "pattern" may mean "member"; the term "electrode line" may mean "electrode set."

FIG. 1 is a schematic top plan view of a liquid crystal display according to an embodiment.

Referring to FIG. 1, the liquid crystal display includes a display panel including a display area DA and a peripheral area PA disposed outside the display area DA. The display device may further include a backlight 900 providing light to the display panel 100.

The display area DA as a region capable of displaying an image according to an input image includes a plurality of pixels PX, a plurality of gate lines 120, and a plurality of pairs of data lines 171a and 171b.

Each pixel PX is a basic unit for displaying the image and may include a part emitting/transmitting light and a part blocking light. The plurality of pixels PX may be arranged in a matrix.

Each pixel PX may include at least one switching element electrically connected to one among the plurality of gate lines 120, one among the plurality of pairs of data lines 171a and 171b, and one pixel electrode. The switching element, such as a thin film transistor, may include a gate terminal, an input terminal, and an output terminal.

The switching element is turned on or turned off according to the gate signal of the gate line 120, thereby transmitting the data voltage from one of the data lines 171a and 171b to the pixel electrode. The pixel PX may display the corresponding image depending on the data voltage applied to the pixel electrode.

For displaying various colors, each pixel PX may display one among primary colors, and an image of a desired color may be recognized by a spatial and temporal combination of the primary colors. For example, the primary colors may be three primary colors such as red, green, and blue, and white may be further included.

A gate line 120 may transmit a gate signal such as the gate-on voltage and the gate-off voltage, etc. The plurality of gate lines 120 may substantially extend in a first direction DR1.

One gate line 120 transmitting one gate signal may include first and second sub-gate lines 121 and 122 electrically connected to each other. Each of the sub-gate lines 121 and 122 may be substantially elongated in the first direction DR1, and the first and second sub-gate lines 121 and 122 may be in parallel to each other in the display area DA. The first sub-gate line 121 and the second sub-gate line 122 may be arranged in the second direction DR2. The first and second sub-gate lines 121 and 122 included in one gate line 120 may be respectively disposed in different pixel rows PXR and may be electrically connected to the plurality of pixels PX included in the corresponding pixel row PXR. The first and second sub-gate lines 121 and 122 included in one gate line 120 may be physically and electrically connected to each other near right/left edges of the display area DA or at the peripheral area PA, thereby transmitting the same gate signal.

The data lines 171a and 171b may transmit at least a data voltage corresponding to an image signal input to the display device. The plurality of pairs of data lines 171a and 171b may be arranged in the first direction DR1, and each of the data lines 171a and 171b may be mainly elongated in the second direction DR2.

A pair of data lines 171a and 171b may be disposed corresponding to each pixel column PXC. The first data lines 171a and the second data lines 171b may be alternately arranged in the first direction DR1. A pair of data lines 171a and 171b corresponding to one pixel column PXC may transverse the inside of the pixel PX of the corresponding pixel column PXC and may overlap the pixel electrode. Particularly, the data lines 171a and 171b may pass through the inside of the region where light is transmitted to each pixel PX in the corresponding pixel column PXC. A pair of data lines 171a and 171b corresponding to one pixel column PXC may transmit different data voltages from each other.

A pair of data lines 171a and 171b corresponding to one pixel column PXC are electrically connected to the plurality of pixels PX included in the corresponding pixel column PXC. Particularly, in one pixel column PXC, two pixels PX respectively electrically connected to first and second sub-gate lines 121 and 122 are electrically connected to the different data lines 171a and 171b of a pair of data lines 171a and 171b. Accordingly, in one pixel column PXC, the different pixels PX connected to one gate line 121 may receive data voltages corresponding to each through the different data lines 171a and 171b at the same time. For example, as shown in FIG. 1, in each pixel column PXC, the plurality of pixels PX arranged in the second direction DR2 may be alternately electrically connected to a pair of corresponding data lines 171a and 171b.

In the display panel, the number of data lines 171a and 171b can be approximately twice the total number of the pixel columns PXC.

Most of the peripheral area PA may not transmit light. A plurality of signal lines transmitting driving control signals to a gate driver 400 and a data driver 500 may be disposed in the peripheral area PA.

The gate driver 400 is connected to the gate line 120, and may transmit the gate signal to the gate line 120 according to the control of a timing controller. The gate driver 400 is disposed on the left with respect to the display area DA, however one gate driver 400 may be further disposed at the right. The gate driver 400 may be directly formed at the peripheral area PA of the display panel 100 through the same process along with an electrical element such as a thin film transistor of the display area DA.

The data driver 500 is connected to the data lines 171a and 171b. The data driver 500 may apply the data voltage as a gray voltage corresponding to the input image signal to the data lines 171a and 171b depending on the control of the timing controller. The data driver 500 may be mounted on the peripheral area PA of the display panel 100 as a type of a plurality of driving chips, or may be mounted on a flexible printed circuit film or a printed circuit board (PCB) electrically connected to the display panel 100.

The backlight 900 may be positioned at the rear surface of the display panel 100 to provide light to the display panel 100, and may include a plurality of light-emitting elements arranged in a plane or linear manner, and various optical films.

Figure 2:
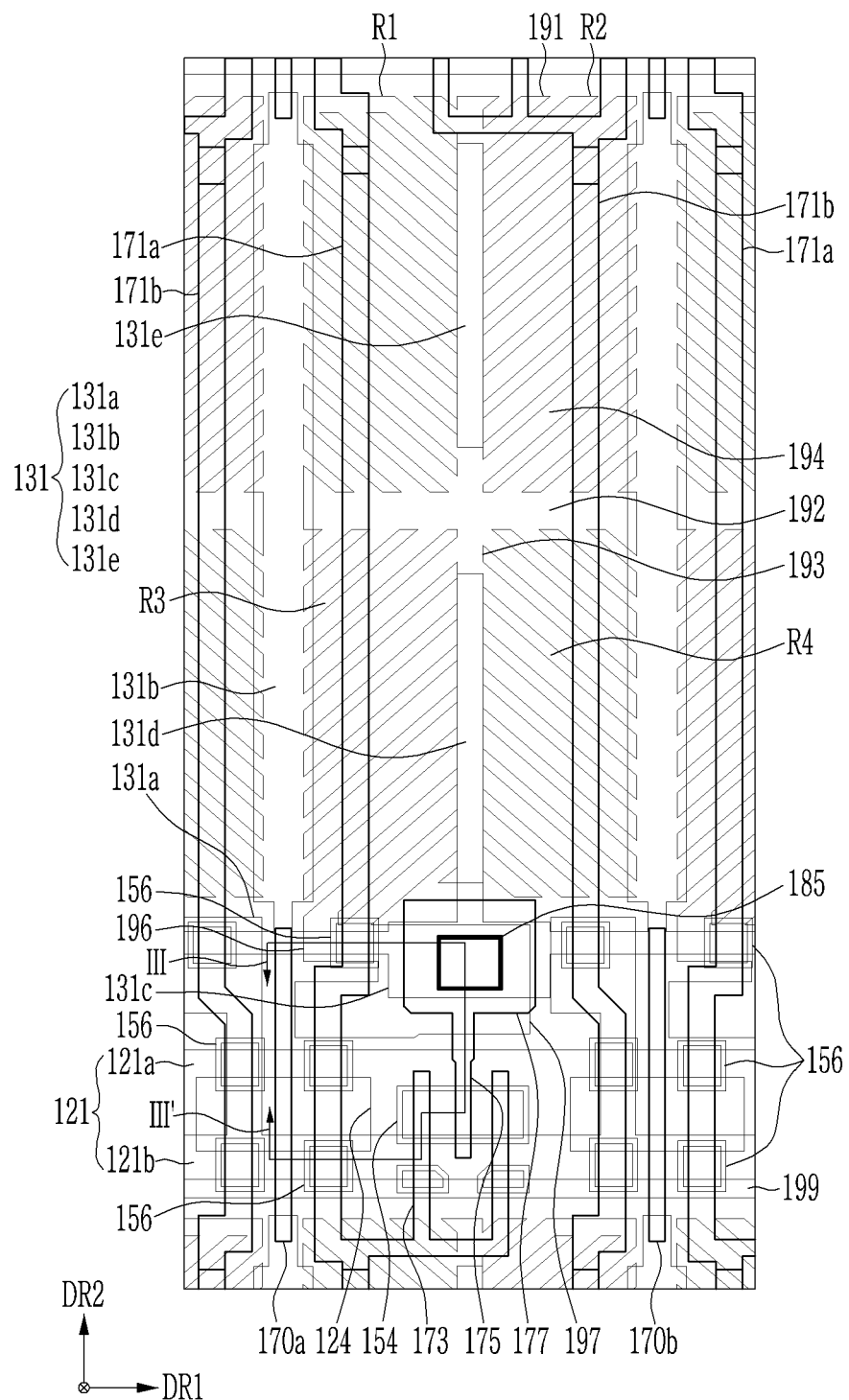
FIG. 2 is a top plan view illustrating one pixel of a liquid crystal display according to an embodiment.
Figure 3:
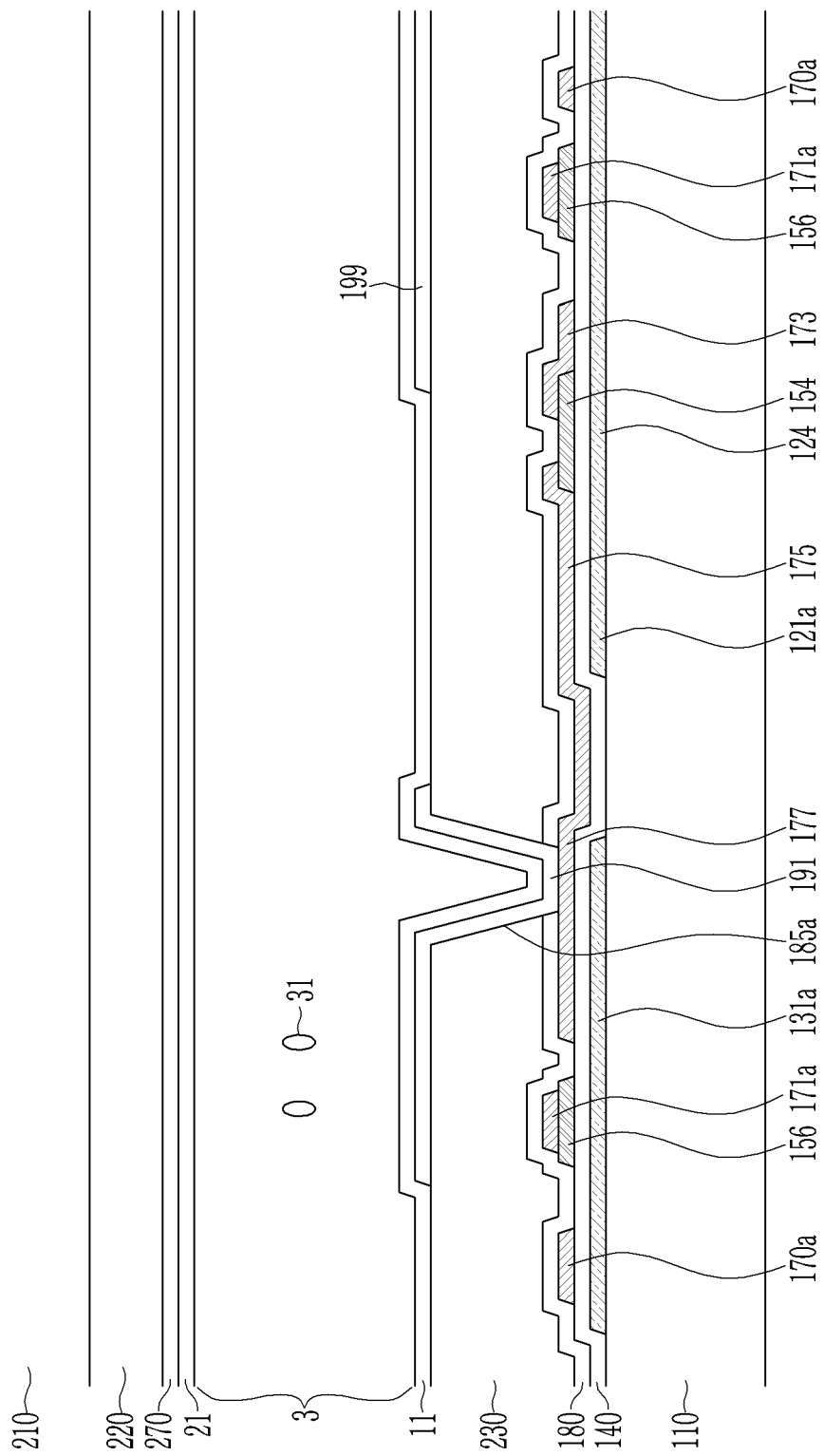
FIG. 3 is a cross-sectional view taken along a line III-III' of FIG. 2 according to an embodiment.

FIG. 2 illustrates a top plan view of one pixel of a liquid crystal display according to an embodiment, and FIG. 3 is a cross-sectional view taken along a line III-III' of FIG. 2 according to an embodiment.

The liquid crystal display includes a first substrate 110 and a second substrate 210, and a liquid crystal layer 3 interposed between the first and second substrates 110 and 210.

A gate conductive layer including a gate line 121, a gate electrode 124, and a storage electrode line 131 is disposed on the first substrate 110. The gate conductive layer may include at least one among metals such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), an alloy, etc.

The gate line 121 may include a plurality of gate lines 121a and 121b and may include the gate electrode 124. The gate line 121 may extend in the first direction DR1, and may include two gate lines 121a and 121b. The two gate lines 121a and 121b extend in parallel in the first direction DR1, and may be connected to enclose the gate electrode 124.

The storage electrode line 131 is separated from the gate line 121 and the gate electrode 124, and may transmit a predetermined voltage such as a common voltage. The storage electrode line 131 may be disposed on the first substrate 110, may be formed on the same layer as the gate line 121, and may be made of the same material as the gate line 121.

The storage electrode line 131 may include one transverse part 131a extending in the first direction DR1, a plurality of longitudinal parts 131b and 131d connected to the transverse part 131a and extending in the second direction DR2, and an expansion part 131c as a part of which a part of the transverse part 131a is expanded.

The plurality of longitudinal parts 131b and 131d may include two longitudinal parts 131b disposed on respective sides of the pixel electrode 191, and one longitudinal part 131d extending upward in the second direction DR2 from the expansion part 131c.

The storage electrode line 131 may further include a floating storage electrode 131e separated on the upper side of one longitudinal part 131d and disposed in the first direction DR1.

The storage electrode line 131 may be disposed at the upper side of the gate line 121, and may overlap the edge of the pixel electrode 191. This is described in detail after describing the pixel electrode 191.

A gate insulating layer 140 is disposed on the gate conductive layer. The gate insulating layer 140 may be made of an inorganic insulating layer material such as a silicon nitride (SiNx) or a silicon oxide (SiOx). In an embodiment, an organic insulator material may be used for the gate insulating layer 140.

A semiconductor layer including a channel semiconductor 154 and a plurality of step-preventing semiconductors 156 is disposed on the gate insulating layer 140. The semiconductor layer may include amorphous or polycrystalline silicon or an oxide semiconductor material. The channel semiconductor 154 may overlap with the gate electrode 124.

A data conductive layer including a pair of data lines 171a and 171b including a source electrode 173, a drain electrode 175, and repair patterns 170a and 170b is disposed on the gate insulating layer 140 and the semiconductor layer. The data conductive layer may include at least one among metals such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), an alloy, etc.

The first data line 171a and the second data line 171b substantially extend in the second direction DR2 and cross the gate line 121. The first data line 171a includes a source electrode 173. The second data line 171b may include a source electrode 173.

A source electrode 173 overlaps the gate electrode 124 and may have substantially U-shaped structure. The source electrode 173 may have one or more other shapes.

The plurality of step-preventing semiconductors 156 are disposed between where the gate conductive layer and the data line 171 are crossed, and may prevent the data line 171 from being disconnected by a step generated due to the gate conductive layer.

The drain electrode 175 is separated from the data line 171 and the source electrode 173. The drain electrode 175 may include a part facing the source electrode 173 in the region overlapping the gate electrode 124, and an expansion part 177. As shown in FIG. 3, the expansion part 177 may be disposed above the gate line 121 and the gate electrode 124. Most of the region between the drain electrode 175 and the source electrode 173 facing each other may overlap the channel semiconductor 154.

As show in FIG. 3, the expansion part 177 and the expansion part 131c of the storage electrode line 131 may overlap. The expansion part 177 overlaps the expansion part 131c of the storage electrode line 131 via the gate insulating layer 140, thereby forming a storage capacitor Cst. The storage capacitor Cst may have a function of maintaining the voltage applied to the drain electrode 175 and the pixel electrode 191 connected thereto even when the data voltage is not applied to the drain electrode 175 and the pixel electrode 191 from the data lines 171a and 171b.

The gate electrode 124, the source electrode 173, and the drain electrode 175 form a thin film transistor as a switching element along with the channel semiconductor 154, and a channel of the thin film transistor is formed in the channel semiconductor 154 between the source electrode 173 and the drain electrode 175.

The repair patterns 170a and 170b are disposed on the gate insulating layer 140, and are formed on the same layer as the data line 171, the source electrode 173, or the drain electrode 175. The repair patterns 170a and 170b are disposed in parallel to be separated from a pair of data lines 171, and may extend in the second direction DR2. The repair patterns 170a and 170b may be disposed outside the first and second data lines 171a and 171b, and may be disposed between a first data line 171a and a second data line 171b that are adjacent to each other.

The repair patterns 170a and 170b may be made of an electrically conductive material, for example, a metal such as one or more of aluminum (Al), silver (Ag), chromium (Cr), and an alloy.

The repair patterns 170a and 170b may overlap the transverse part 131a of the storage electrode line 131, the gate line 121, and/or one longitudinal part 131b of the storage electrode line 131.

Figure 4:
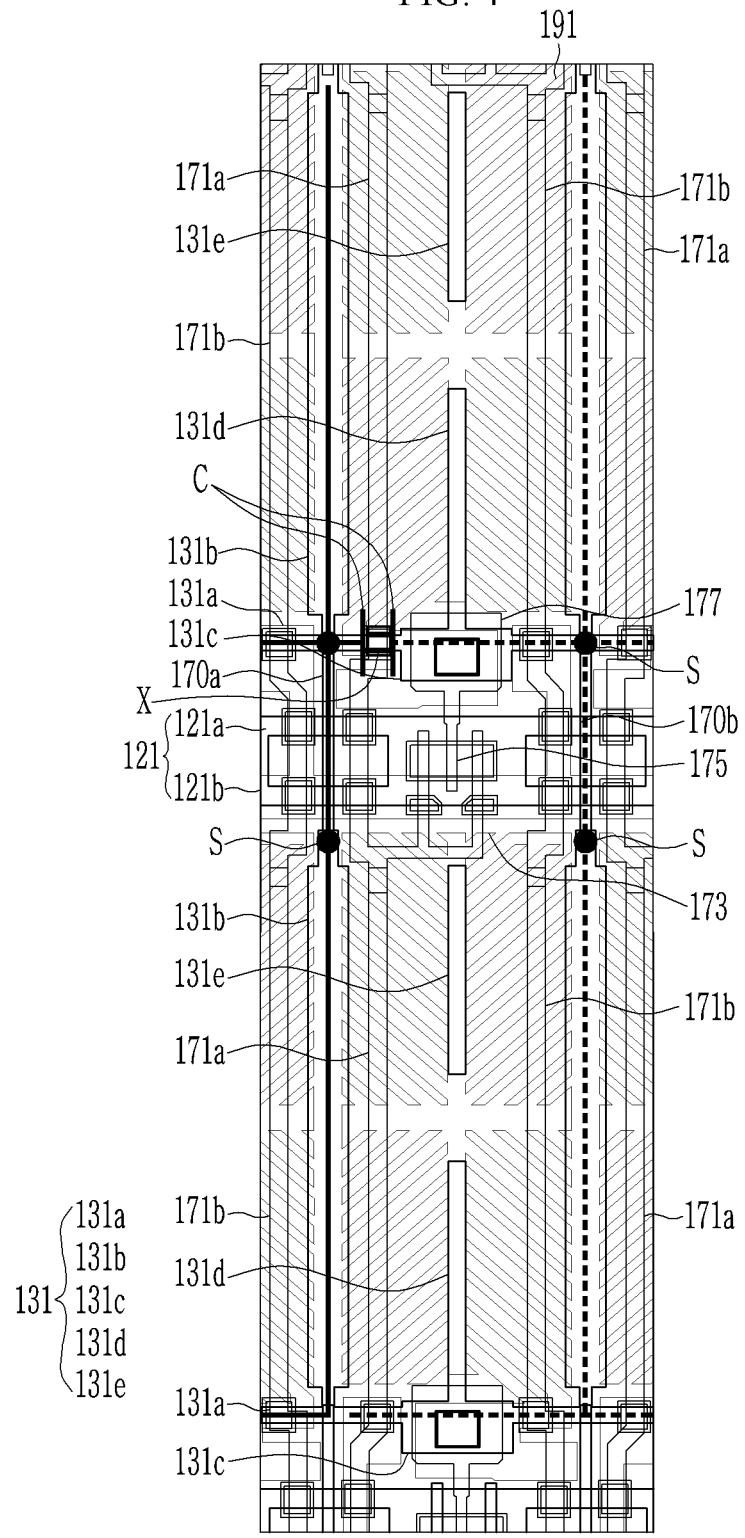
FIG. 4 is a top plan view illustrating two pixels of a liquid crystal display after a repair process according to an embodiment.

Referring to FIG. 4, one end of each of the repair patterns 170a and 170b may overlap the position where the transverse part 131a and the longitudinal part 131b of the storage electrode line 131 meet. The repair patterns 170a and 170b extend from the transverse part 131a of the storage electrode line 131 in the opposite direction to the second direction DR2, and ma cross the gate line 121. The other end of each of the repair patterns 170a and 170b may overlap the longitudinal part 131b of the storage electrode line 131 of the immediately adjacent pixel.

A passivation layer 180 is disposed on the data conductive layer and the exposed semiconductor layer. The passivation layer 180 may be the inorganic insulating layer material such as a silicon nitride (SiNx), a silicon oxide (SiOx), etc.

The passivation layer 180 may include a contact hole 185. The contact hole 185 is disposed on the expansion part 177 of the drain electrode 175, thereby connecting the drain electrode 175 and the pixel electrode 191.

A color filter 230 may be disposed on the passivation layer 180, and may uniquely display one among primary colors.

A pixel electrode layer including a pixel electrode 191 and a shielding electrode 199 may be disposed on the passivation layer 180. The pixel electrode layer may include a transparent conductive material such as ITO (indium tin oxide), IZO (indium zinc oxide), etc., or at least one of aluminum (Al), silver (Ag), chromium (Cr), an alloy, etc.

Referring to FIG. 2, the overall shape of the pixel electrode 191 is an approximate quadrangle, and may include a pattern where the pixel electrode 191 is partially removed. According to the pattern of the pixel electrode 191, the pixel electrode 191 may include a transverse stem part 192, a longitudinal stem part 193, a plurality of minute branch parts 194, a connection part 195, and an expansion part 196.

The transverse stem part 192 extends in the first direction DR1, and the longitudinal stem part 193 is connected to the transverse stem part 192 in a cross shape and approximately extends in the second direction DR2.

The pixel electrode 191 may be divided into four sub-regions R1, R2, R3, and R4 by the transverse stem part 192 and the longitudinal stem part 193.

The plurality of minute branch parts 194 are disposed in four sub-regions R1, R2, R3, and R4, and obliquely extend from the transverse stem part 192 and the longitudinal stem part 193 in a diagonal direction from the first direction DR1 and the second direction DR2. The minute branch parts 194 of two sub-regions R1 and R2, and R3 and R4, facing each other via the longitudinal stem part 193 extend in different directions from each other.

The electrode is removed between the adjacent minute branch parts 194, and this is hereinafter referred to as a minute slit.

An acute angle formed between the minute branch parts 194 and the transverse stem part 192 or the longitudinal stem part 193 may be about 40° to 45°. In an embodiment, the angle may be appropriately configured in consideration of display characteristics such as visibility and the like of the liquid crystal display.

The connection part 195 may be connected to the minute branch parts 194 of the sub-region R3. The expansion part 196 may be connected to the minute branch parts 194 of the sub-region R3 through the connection part 195, and may overlap the expansion part 177 of the drain electrode 175.

The expansion part 196 of the pixel electrode 191 is electrically connected to the drain electrode 175 through the contact hole 185, thereby receiving the data voltage.

As shown in FIG. 2, the ends of the left and right edges of the pixel electrode 191 may overlap the longitudinal part 131b of the storage electrode line 131, or alternatively, may not overlap the longitudinal part 131b.

The shielding electrode 199 is separated from the pixel electrode 191, may substantially extend in the first direction DR1, and may be disposed in the region overlapping part of the plurality of gate lines 121a and 121b. The shielding electrode 199 may overlap the gate line 121, and may be disposed in the second direction DR2 to overlap part of the second data line 171b.

The shielding electrode 199 receives the same voltage as the common electrode 270. The electric field is not generated between the shielding electrode 199 and the common electrode 270, and the liquid crystal molecules are not rearranged. The liquid crystal between the shielding electrode 199 and the common electrode 270 displays a black state. As above-described, when the liquid crystal molecules display the black, liquid crystal molecules themselves may function as a light blocking member.

The second substrate 210 faces the first substrate 110.

A light blocking member 220 may be disposed under the second substrate 210. The light blocking member 220 may prevent light leakage between adjacent pixel electrodes 191. Particularly, the light blocking member 220 may be mainly disposed at the region between the adjacent pixel electrodes 191. The light blocking member 220 may include an opening (not shown) transmitting light.

An overcoat (not shown) is disposed under the light blocking member 220 and covers the liquid crystal layer 3. The overcoat (not shown) may be made of the organic insulating material. The overcoat (not shown) prevents the light blocking member 220 from being exposed and provides a flat surface.

A common electrode 270 is disposed under the second substrate 210 and the light blocking member 220. The common electrode 270 may be continuously formed in most of the region corresponding to the display area DA. The common electrode 270 may also include a transparent conductive material such as ITO (indium tin oxide), IZO (indium zinc oxide), etc., or the metal of aluminum (Al), silver (Ag), chromium (Cr), alloys thereof, etc., like the pixel electrode layer. The common electrode 270 may not be patterned to include the slit, etc., or the slit or a cutout may be included if necessary.

The color filter 230 disposed on the first substrate 110 may be alternatively disposed between the second substrate 210 and the common electrode 270.

The liquid crystal layer 3 is disposed between the first substrate 110 and the second substrate 210.

The liquid crystal layer 3 may include liquid crystal molecules 31 having negative dielectric anisotropy. The liquid crystal molecules 31 may be aligned so that long axes thereof are oriented at a predetermined angle or are perpendicular to the surface of the first and second substrates 110 and 210 when an electric field is not applied to the liquid crystal layer 3. The liquid crystal molecules 31 may be pretilted along the fringe field or the step between the edges of the patterned portions (e.g., the minute branch parts 194) of the pixel electrode 191 and the common electrode 270.

An alignment layer 11 covering the pixel electrode 191 and the color filter 230 may be disposed on the first substrate 110, and an alignment layer 21 may be disposed under the common electrode 270 on the second substrate 210. The two alignment layers 11 and 21 may be vertical alignment layers. A plurality of polymer protrusions formed by treating a reactive monomer (RM) with light such as ultraviolet rays may be positioned at the surface of the alignment layers 11 and 21 adjacent to the liquid crystal layer 3, and these polymer protrusions may function for maintaining the pretilt of the liquid crystal molecules 31 of the liquid crystal layer 3.

As the pixel electrode 191 to which the data voltage is applied generates the electric field along with the common electrode 270 of the second substrate 210, an arrangement direction of the liquid crystal molecules of the liquid crystal layer 3 disposed between the two electrodes 191 and 270 is determined. Depending on the directions of the liquid crystal molecules determined as such, luminance of light passing through the liquid crystal layer 3 is controlled.

The data voltage is only applied to the pixel electrode 191, however if a short circuit is generated in the region where the data line 171 and the storage electrode line 131 are crossed and overlapped with each other, the common voltage signal and the data signal are mixed such that the correct data signal may not be applied.

In this case, at the position where the first data line 171a and the storage electrode line 131 are overlapped, the correct data signal may be applied to the pixel electrode 191 by cutting the position of the storage electrode line 131. If this defect appears after completing the display panel, this defect is repaired through a repair process, and the pixel PX structure after the repair process is described hereinafter.

FIG. 4 is a top plan view of two pixels illustrating a liquid crystal display after a repair process according to an embodiment.

The two pixels include the first pixel PX1 and the second pixel PX2 adjacent in the row direction, and the arrangement structure of the first pixel PX1 and the second pixel PX2 is the same as the top plan view of one pixel shown in FIG. 2.

Referring to FIG. 4, at the position X where the first data line 171a and the transverse part 131a of the storage electrode line 131 overlap each other and an unwanted short circuit is formed, two portions C of the transverse part 131a of the storage electrode line 131 disposed at opposite sides of the first data line 171a may be cut. If both portions C of the shorted part X on the transverse part 131a are cut, the first data line 171a may receive the correct data signal.

However, if parts of the transverse part 131a of the storage electrode line 131 are cut, the common voltage may not applied to the region including the expansion part 131c (connected to the transverse part 131a of the storage electrode line 131) and the longitudinal parts 131b and 131d (connected to the expansion part 131c).

If parts of the storage electrode line 131 are cut, to solve the above-mentioned problem that the common voltage is not properly applied, the repair patterns 170a and 170b (disposed throughout the storage electrode line 131 of the first pixel PX1 and the storage electrode line 131 of the second pixel PX2) may be used.

In the repair process, a laser is irradiated to one end S of each of the repair patterns 170a and 170b and the corresponding transverse part 131a of the storage electrode line 131 in the first pixel PX1, and a laser is irradiated to the other end S of each of the repair patterns 170a and 170b and the corresponding longitudinal part 131b of the storage electrode line 131 in the second pixel PX2. One end S of each of the repair patterns 170a and 170b and the corresponding transverse part 131a of the storage electrode line 131 are connected through a contact hole (corresponding to the end S) formed in the gate insulating layer 140, and the other end S of each of the repair patterns 170a and 170b and the corresponding longitudinal part 131b of the storage electrode line 131 are connected through a contact hole (corresponding to the end S) formed in the gate insulating layer 140.

The repair patterns 170a and 170b that are treated by the lasers may electrically connect the storage electrode line 131 of the first pixel PX1 to the storage electrode line 131 of the second pixel PX2. As a result, the common voltage applied to one side transverse part 131a of the storage electrode line 131 in the first pixel PX1 is applied to the longitudinal part 131b of the second pixel PX2 through the repair pattern 170a connected to the transverse part 131a (indicated by a bold solid line). The common voltage applied through the longitudinal part 131b of the second pixel PX2 is applied to the second pixel PX region through the expansion part 131c extended from the transverse part 131a and the longitudinal parts 131b and 131d (indicated by a dotted line). The common voltage may also be applied to the transverse part 131a, the longitudinal parts 131b and 131d, and the expansion part 131c of the storage electrode line 131 of the first pixel PX1 through the repair pattern 170b connected to the longitudinal part 131b of the second pixel PX2 (indicated by a dotted line).

Therefore, even if parts of the storage electrode line 131 of the pixel with an unwanted short circuit are cut, the common voltage may be sufficiently applied to the storage electrode line 131 of the adjacent pixel by the repair patterns 170a and 170b.

Advantageously, in the display device according to an embodiment, the data signal may be correctly applied to each pixel, and the common voltage may be applied without the disconnection.

Figure 5:
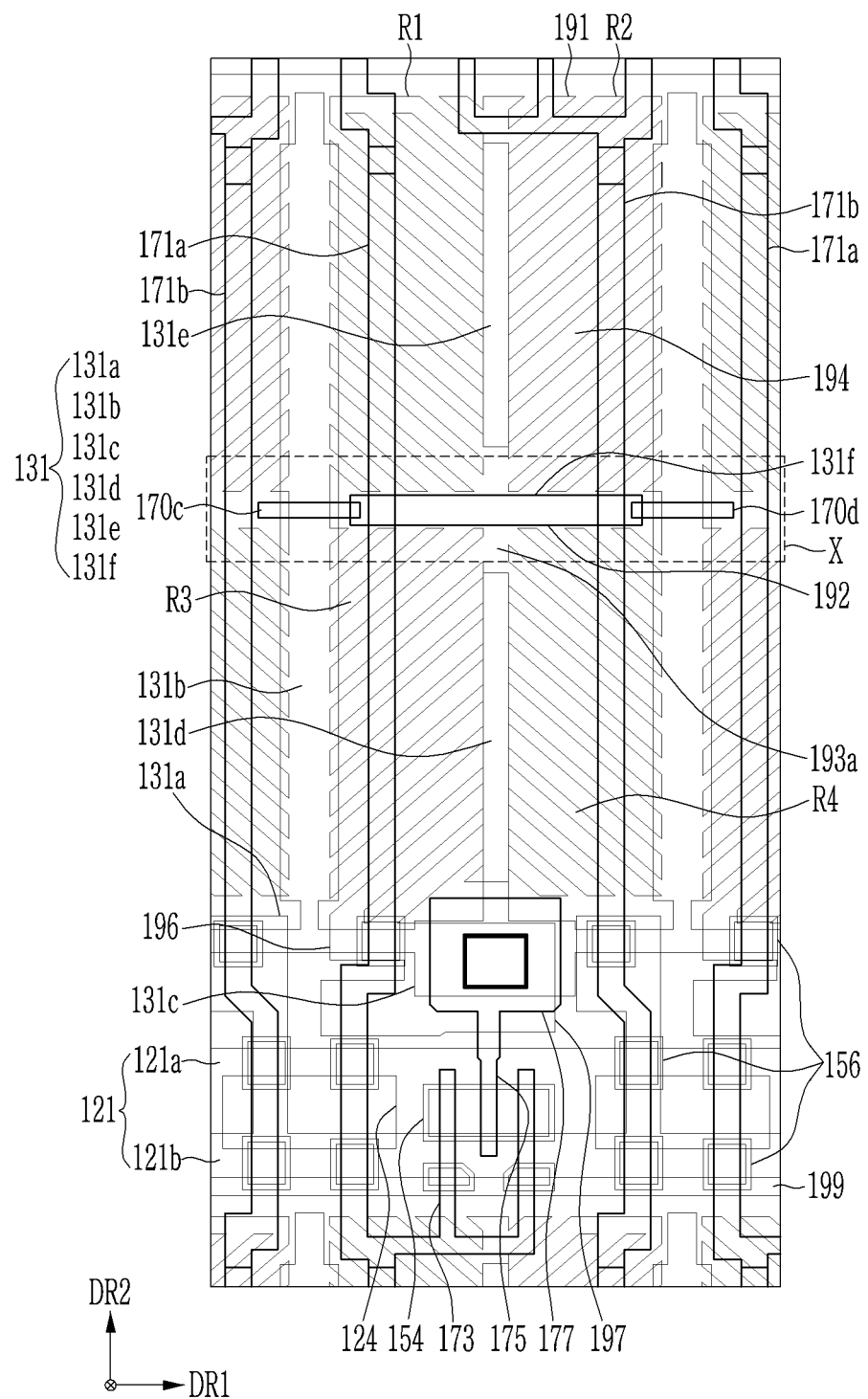
FIG. 5 is a top plan view illustrating one pixel of a liquid crystal display according to an embodiment.
Figure 6:
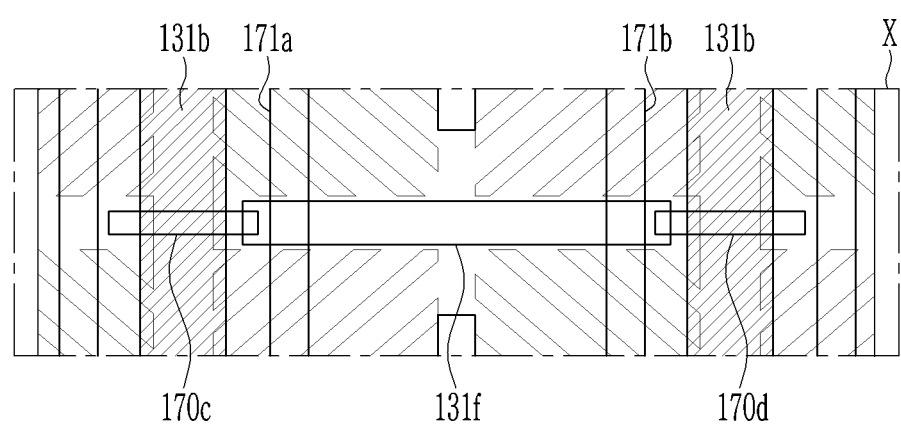
FIG. 6 is illustrates region of the structure shown in FIG. 5 according to an embodiment.
Figure 7:
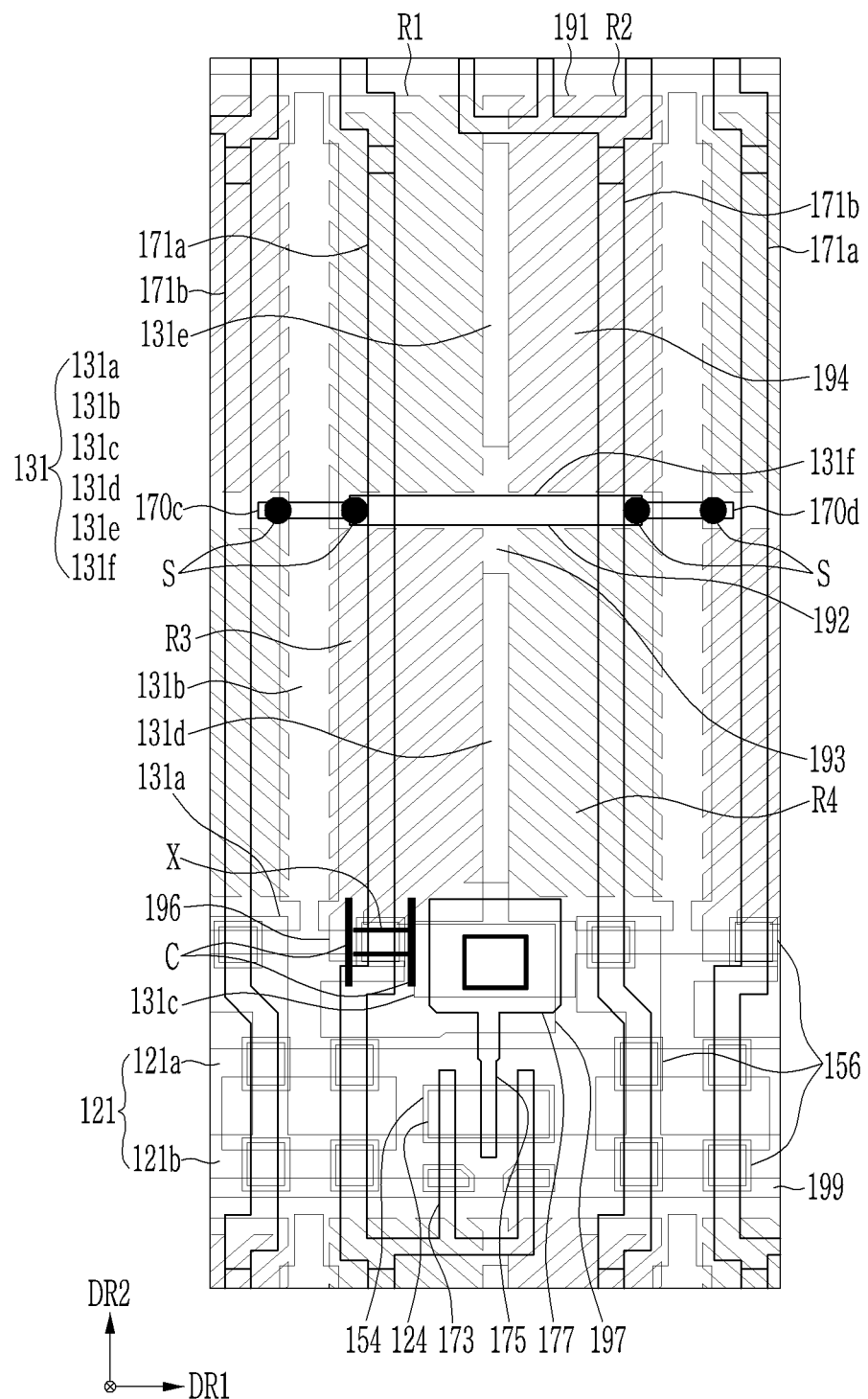
FIG. 7 is a top plan view illustrating one pixel of a liquid crystal display after a repair process according to an embodiment.

FIG. 5 is a top plan view illustrating one pixel of a liquid crystal display according to an embodiment, and FIG. 6 illustrates a region of the structure shown in FIG. 5 according to an embodiment. FIG. 7 is a top plan view illustrating one pixel of a liquid crystal display after a repair process according to an embodiment.

The gate line 121 may include the plurality of gate lines 121a and 121b, and may include the gate electrode 124. The gate line 121 may extend in the first direction DR1 and may include two gate lines 121a and 121b. The two gate lines 121a and 121b extend in parallel in the first direction DR1 and may be connected to enclose the gate electrode 124.

The storage electrode line 131 is separated from the gate line 121 and the gate electrode 124, and may transmit a predetermined voltage such as the common voltage.

The storage electrode line 131 may be insulated from the gate line 121 and may overlap an edge of the pixel electrode 191.

The storage electrode line 131 may include one transverse part 131a extending in the first direction DR1, a plurality of longitudinal parts 131b and 131d connected to the transverse part 131a and extending in the second direction DR2, and an expansion part 131c as a part of which the part of the transverse part 131a is expanded.

The plurality of longitudinal parts 131b and 131d may include two longitudinal parts 131b disposed on respective sides of the pixel electrode 191 and one longitudinal part 131d extending upward in the second direction DR2 from the expansion part 131c.

The storage electrode line 131 may further include a longitudinal floating storage electrode 131e separated (and insulated) from one longitudinal part 131d in the second direction DR2. The storage electrode line 131 may further include a transverse floating storage electrode 131f extending in the first direction DR1 and crossing the data lines 171a and 171b.

The longitudinal floating storage electrode 131e may overlap the longitudinal stem part 193 of the pixel electrode 191, and the transverse floating storage electrode 131f may overlap the transverse stem part 192 of the pixel electrode 191. The transverse floating storage electrode 131f may be separated (and insulated) from the longitudinal part 131b of the storage electrode line 131.

A gate insulating layer may be disposed on the gate conductive layer including the gate line 121, the gate electrode 124, and the storage electrode line 131. A semiconductor layer including a channel semiconductor and a plurality of step-preventing semiconductors may be disposed on the gate insulating layer.

A data conductive layer including the data line 171, the source electrode 173, the drain electrode 175, and repair patterns 170c and 170d may be disposed on the gate insulating layer 140 and the semiconductor layer.

The first data line 171a and the second data line 171b substantially extend in the second direction DR2 and cross the gate line 121. The first data line 171a includes a source electrode 173. The second data line 171b may include a source electrode 173.

A source electrode 173 overlaps the gate electrode 124 and may have a substantially U-shaped structure.

The drain electrode 175 is separated from the data line 171 and the source electrode 173. The drain electrode 175 may include the part facing the source electrode 173 in the region overlapping the gate electrode 124, and an expansion part 177.

The gate electrode 124, the source electrode 173, and the drain electrode 175 form a thin film transistor as a switching element along with the channel semiconductor, and a channel of the thin film transistor is formed in the channel semiconductor between the source electrode 173 and the drain electrode 175.

The repair patterns 170c and 170d are disposed on the gate insulating layer 140, and are formed on the same layer (and formed of the same material) as the data lines 171a and 171b, the source electrode 173, or the drain electrode 175. The repair patterns 170c and 170d each extend in the first direction DR1 and overlap in and cross a corresponding longitudinal part 131b of the storage electrode line 131. The repair patterns 170c and 170d may be as aligned with the transverse floating storage electrode 131f in a plan view of the display device.

Referring to FIG. 6, the repair patterns 170c and 170d may each protrude beyond the corresponding longitudinal part 131b of the storage electrode line 131 without overlapping a data line 171a or 171b.

One end of each of the repair patterns 170c and 170d may overlap one end of the transverse floating storage electrode 131f. In an embodiment, the other end may overlap one end of the transverse floating storage electrode 131f of an adjacent pixel.

Again referring to FIG. 5, in the display device according to an embodiment, if an unwanted short circuit is formed in the region where the data line 171 and the storage electrode line 131 overlap, the common voltage signal and the data signal are mixed such that the correct signal may not be applied.

In an embodiment, referring to FIG. 7, at the position X where the data line 171 and the storage electrode line 131 overlap each other, portions C of the transverse part 131a of the storage electrode line 131 may be cut. If both portions C of the shorted part X of the transverse part 131a are cut, the first data line 171a may apply the correct data signal to the pixel electrode 191.

However, if parts of the transverse part 131a are cut, the common voltage is not applied to regions including the expansion part 131c (connected to the transverse part 131a of the storage electrode line 131), the longitudinal part 131b and 131d (connected to the expansion part 131c), etc.

If parts of the storage electrode line 131 are cut, to solve the above-mentioned problem of insufficient common voltage supply, the repair patterns 170c and 170d overlapping the transverse floating storage electrode 131f may be used.

Again referring to FIG. 7, in the repair process, a laser is irradiated to each of one end S of the repair pattern 170c and one end S of the transverse floating storage electrode 131f, and a laser is irradiated to each of the other end S of the transverse floating storage electrode 131f and one end S of the repair pattern 170d. A laser may be irradiated to each of one end S of the transverse floating storage electrode 131f in the adjacent pixels and the other end S of the repair pattern 170c.

The repair patterns 170c and 170d treated by the laser may be connected to the transverse floating storage electrode 131f. As a result, two longitudinal parts 131b of the storage electrode line 131 may be connected through the elements 170c, 131f, and 170d. Even if parts of the transverse part 131a of the storage electrode line 131 are cut for avoiding mixture of the data signal and the common voltage signal, the transverse part storage electrode line for applying the common voltage to each pixel may remain connected, for the common voltage to be applied to all regions of the pixel.

Figure 8:
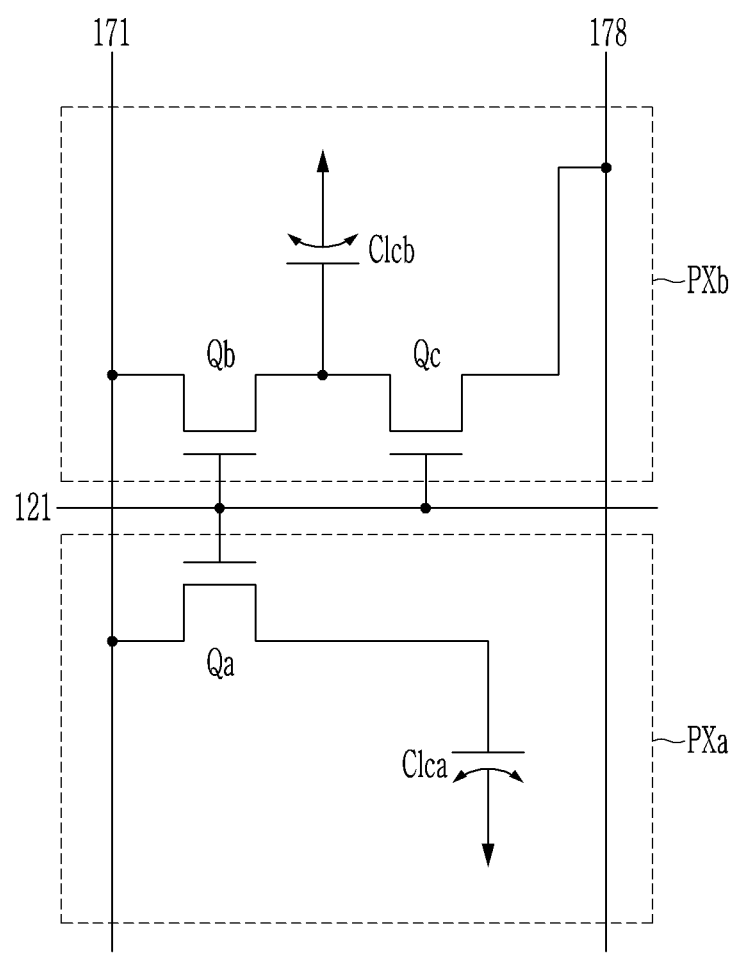
FIG. 8 is an equivalent circuit diagram illustrating one or more pixels of a liquid crystal display according to an embodiment.
Figure 9:
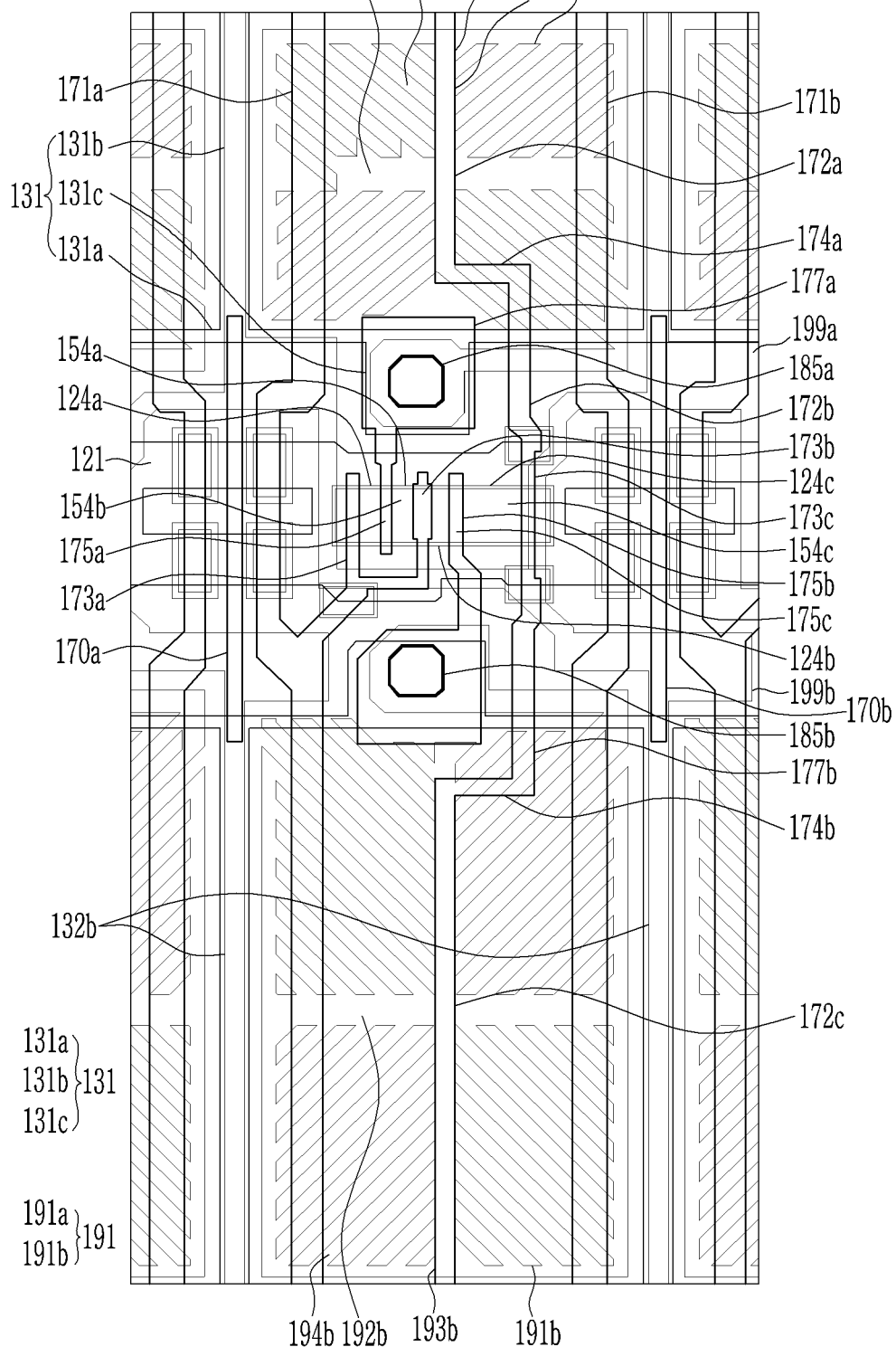
FIG. 9 is a top plan view illustrating one pixel of a liquid crystal display according to an embodiment.
Figure 10:
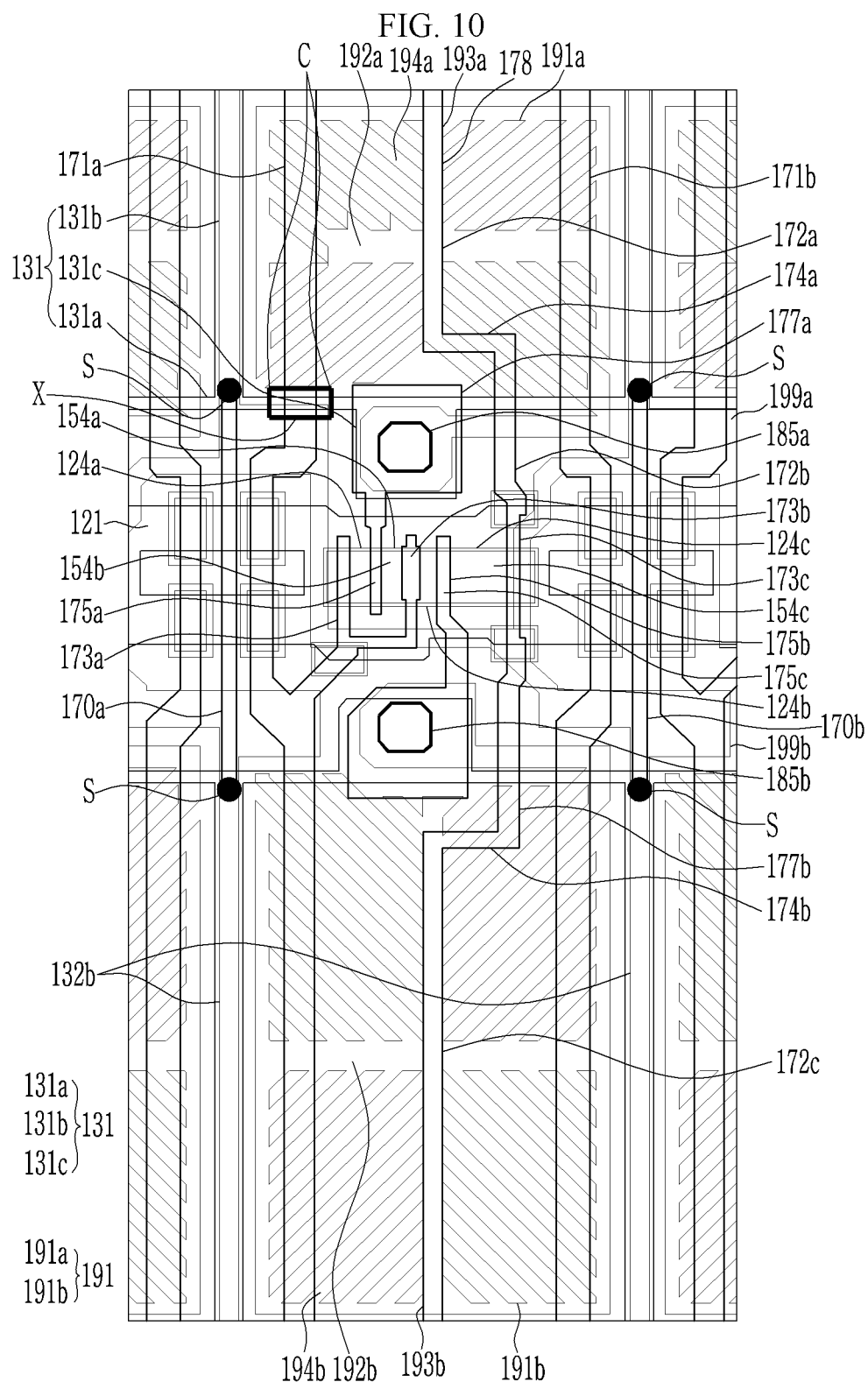
FIG. 10 is a top plan view of one pixel of a liquid crystal display after a repair process according to an embodiment.

FIG. 8 is an equivalent circuit diagram of one pixel of a liquid crystal display according to an embodiment, and FIG. 9 is a top plan view illustrating one pixel of a liquid crystal display according to an embodiment. FIG. 10 is a top plan view illustrating one pixel of a liquid crystal display after a repair process according to an embodiment.

Referring to FIG. 8, the liquid crystal display includes signal lines such as a gate line 121, a data line 171, and a reference voltage line 178 for transmitting a reference voltage and includes one or more pixels connected to the signal lines.

Each pixel includes a first subpixel PXa and a second subpixel PXb. The first subpixel PXa includes a first thin film transistor Qa and a first liquid crystal capacitor Clca, and the second subpixel PXb includes a second thin film transistor Qb, a third thin film transistor Qc, and a second liquid crystal capacitor Clcb.

The first thin film transistor Qa and the second thin film transistor Qb are each connected to the gate line 121 and the data line 171, and the third thin film transistor Qc is connected to the output terminal of the second thin film transistor Qb and the reference voltage line 178.

The output terminal of the first thin film transistor Qa is connected to the first liquid crystal capacitor Clca, and the output terminal of the second thin film transistor Qb is connected to the second liquid crystal capacitor Clcb and the input terminal of the third thin film transistor Qc. The control terminal of the third thin film transistor Qc is connected to the gate line 121, the input terminal is connected to the second liquid crystal capacitor Clcb, and the output terminal is connected to the reference voltage line 178.

If the gate-on voltage Von is applied to the gate line 121, the first thin film transistor Qa, the second thin film transistor Qb, and the third thin film transistor Qc that are connected thereto are turned on. Accordingly, the data voltage applied to the data line 171 is applied to the first liquid crystal capacitor Clca and the second liquid crystal capacitor Clcb through the turned-on first thin film transistor Qa and the second thin film transistor Qb such that the first liquid crystal capacitor Clca and the second liquid crystal capacitor Clcb are charged by a difference between a data voltage Vd and a common voltage Vcom. In this case, the same data voltage Vd is transmitted to the first liquid crystal capacitor Clca and the second liquid crystal capacitor Clcb through the first and second thin film transistors Qa and Qb, however the charged voltage of the second liquid crystal capacitor Clcb is divided through the third thin film transistor Qc. Accordingly, since the charged voltage of the second liquid crystal capacitor Clcb becomes smaller than the charged voltage of the first liquid crystal capacitor Clca, the luminance of the two subpixels PXa and PXb may be differentiated. Accordingly, by properly controlling the voltage charged in the first liquid crystal capacitor Clca and the voltage charged in the second liquid crystal capacitor Clcb, an image viewed from the side may be closest to an image viewed from the front, thereby improving side visibility.

Referring to FIG. 9, the liquid crystal display may include an upper substrate and a lower substrate facing each other and may include a liquid crystal layer interposed between the upper substrate and the lower substrate.

A gate conductive layer including the gate line 121 and the first and second storage electrode lines 131 and 132 may be disposed on the lower substrate.

The gate line 121 may include a plurality of gate lines.

The gate line 121 includes a first gate electrode 124a, a second gate electrode 124b, a third gate electrode 124c, and a wide end portion (not shown) connected with other layers or an external driving circuit.

The gate line 121 and the first and second storage electrode lines 131 and 132 may be made of one or more aluminum metals such as aluminum (Al) or an aluminum alloy, one or more silver metals such as silver (Ag) or a silver alloy, copper metals such as copper (Cu) or a copper alloy, one or more molybdenum metals such as molybdenum (Mo) or a molybdenum alloy, chromium (Cr), and/or thallium (Ta), titanium (Ti).

The gate line 121 traverses one pixel along the first direction DR1. A first sub-pixel electrode 191a displaying a high gray may be disposed at the upper side with respect to the gate line 121 and a second sub-pixel electrode 191b displaying a low gray may be disposed at the lower side with respect to the gate line 121 in the second direction DR2, or vice versa.

The first storage electrode line 131 disposed above the gate line 121 and may overlap an edge of the first sub-pixel electrode 191a. The first storage electrode line 131 includes two longitudinal parts 131b, and may include the transverse part 131a connecting the two longitudinal parts 131b. In an embodiment, the transverse part 131a of the first storage electrode line 131 may extend over one pixel area to be connected to the other layers or the external driving circuit.

The second storage electrode line 132 below the gate line 121 may overlap an edge of the second sub-pixel electrode 191b. The second storage electrode line 132 includes two longitudinal parts 132b, and may include the transverse part (analogous to the part 131a of the first storage electrode line 131) connecting the two longitudinal parts 132b.

The first storage electrode line 131 may include the first expansion part 131c, and the second storage electrode line 132 may include a second expansion part 132c. Each of the first expansion part 131c and the second expansion part 132c may have a quadrangle shape in a plan view and may protrude from the transverse parts 131a and 132a. The parts may have one or more other shapes.

The first expansion part 131c may overlap the region at which a first drain electrode 175a extends and the region at which the first sub-pixel electrode 191a is elongated. The first expansion part 131c may overlap the first drain electrode 175a and first sub-pixel electrode 191a.

The second expansion part 132c may overlap a region at which a second drain electrode 175b extends and a region at which the second sub-pixel electrode 191b is elongated. The second expansion part 132c may overlap the second drain electrode 175b and the second sub-pixel electrode 191b.

The storage electrode lines 131 and 132 may have particular shapes that are required to perform the required functions according to embodiments.

The gate insulating layer may be disposed on the gate conductive layer. A first semiconductor layer 154a, a second semiconductor layer 154b, and a third semiconductor layer 154c are disposed on the gate insulating layer.

A data conductive layer including data lines 171a and 171b, a first source electrode 173a, a second source electrode 173b, a third source electrode 173c, a first drain electrode 175a, a second drain electrode 175b, a third drain electrode 175c, and a reference voltage line 178 may be disposed on the first semiconductor layer 154a, the second semiconductor layer 154b, and the third semiconductor layer 154c.

The data conductive layer may further include repair patterns 170a and 170b.

The data lines 171a and 171b extend along pixel area edges in the second direction DR2 and include a first source electrode 173a and a second source electrode 173b.

The first drain electrode 175a is spaced from the first source electrode 173a in a plan view along the first direction DR1, and may include a substantially I-shaped structure. The first drain electrode 175a includes a first expansion part 177a connected to the first sub-pixel electrode 191a.

The second drain electrode 175b is spaced from the second source electrode 173b in a plan view along the first direction DR1, and may include a substantially I-shaped structure. The second drain electrode 175b includes a second expansion part 177b connected to the second sub-pixel electrode 191b.

The third source electrode 173c may be adjacent to the second drain electrode 175b. The reference voltage line 178 includes the third source electrode 173c and the third drain electrode 175c forming the third thin film transistor Qc.

A first longitudinal part 172a included in the reference voltage line 178 may overlap a longitudinal stem part 193a of the first sub-pixel electrode 191a. A second longitudinal part 172b may overlap a longitudinal stem part 193b of the second sub-pixel electrode 191b. A third longitudinal part 172c included in the reference voltage line 178 may traverse the region disposed between the region where the first sub-pixel electrode 191a is disposed and the region where the second sub-pixel electrode 191b is disposed.

The reference voltage line 178 may include a first transverse part 174a connecting the first longitudinal part 172a and the third longitudinal part 172c, and a second transverse part 174b connecting the second longitudinal part 172b and the third longitudinal part 172c.

The first transverse part 174a may overlap the first sub-pixel electrode 191a, and the second transverse part 174b may overlap the second sub-pixel electrode 191b. However, it is not limited to this shape, and the first transverse part 174a and the second transverse part 174b may not overlap the first sub-pixel electrode 191a and the second sub-pixel electrode 191b.

The reference voltage line 178 may have the shape according to the shape of the pixel electrode 191, and the shape of the reference voltage line 178 may be configured according to the shape of the pixel electrode 191.

The first gate electrode 124a, the first source electrode 173a, and the first drain electrode 175a form one first thin film transistor Qa along with the first semiconductor layer 154a, and the channel of the thin film transistor is formed in the first semiconductor layer 154a between the first source electrode 173a and the first drain electrode 175a. The second gate electrode 124b, the second source electrode 173b, and the second drain electrode 175b form one second thin film transistor Qb along with the second semiconductor layer 154b, and the channel is formed in the second semiconductor layer 154b between the second source electrode 173b and the second drain electrode 175b. The third gate electrode 124c, the third source electrode 173c, and the third drain electrode 175c form one third thin film transistor Qc along with the third semiconductor layer 154c, and the channel is formed in the third semiconductor layer 154c between the third source electrode 173c and the third drain electrode 175c.

The repair patterns 170a and 170b are disposed on the gate insulating layer 140, and are disposed on the same layer (and formed of the same material) as the data lines 171a and 171b, the source electrode 173, or the drain electrode 175. The repair patterns 170a and 170b are disposed in parallel, are separated (and insulated) from data lines 171a and 171b, and may extend in the second direction DR2. The repair patterns 170a and 170b may be each disposed outside a pair of data lines 171a and 171b overlapping the same pixel electrode 191, and may be each disposed between two adjacent data lines 171a and 171b that respectively overlapping two adjacent pixel electrodes 191.

The repair patterns 170a and 170b may be made of a conductive material, for example, one or more metals, such as aluminum (Al), silver (Ag), chromium (Cr), and/or an alloy.

The repair patterns 170a and 170b may overlap the transverse part 131a of the first storage electrode line 131, the gate line 121, and corresponding longitudinal parts 131b of the second storage electrode line 132.

One end of each of the repair patterns 170a and 170b may overlap a position at which the transverse part 131a and a corresponding longitudinal part 131b of the first storage electrode line 131 meet. The repair patterns 170a and 170b extend in the second direction DR2 and may cross the gate line 121. The other end of each of the repair patterns 170a and 170b may overlap the corresponding longitudinal part 132b of the second storage electrode line 132. The storage electrode lines 131 and 132 may be disposed at opposite sides of the gate line 121 in a plan view.

The first drain electrode 175a, a first contact hole 185a, and the first sub-pixel electrode 191a overlap each other, and the first drain electrode 175a may be connected to the first sub-pixel electrode 191a through the first contact hole 185a.

The second drain electrode 175b, a second contact hole 185b, and the second sub-pixel electrode 191b overlap, and the second drain electrode 175b may be connected to the second sub-pixel electrode 191b through the second contact hole 185b.

The pixel electrode 191 includes the first sub-pixel electrode 191a and the second sub-pixel electrode 191b that are separated from each other via the gate line 121 and adjacent along the second direction DR2.

The pixel electrode 191 may be made of the transparent material such as ITO or IZO. The pixel electrode 191 may be made of the transparent conductive material such as ITO or IZO, or a reflective metal such as aluminum, silver, chromium, or an alloy.

The first sub-pixel electrode 191a includes a first transverse stem part 192a extending in the first direction DR1, the first longitudinal stem part 193a crossing the first transverse stem part 192a and extending in the second direction DR2, and a plurality of first minute branch parts 194a extending from the first transverse stem part 192a and the first longitudinal stem part 193a in the diagonal direction. The electrode between the adjacent first minute branch parts 194a is removed, and it is referred to as the minute slit below.

An acute angle formed between the first minute branch parts 194a and the first transverse stem part 192a or the first longitudinal stem part 193a may be about 40° to 45°. The size(s) of the angle(s) may be appropriately configured in consideration of display characteristics such as visibility and the like of the liquid crystal display.

The first sub-pixel electrode 191a includes the wide region in which the part of the first minute branch parts (e.g., the minute branch parts 194) is elongated, and may be connected to the first expansion part 177a of the first drain electrode 175a through the wide region.

The second sub-pixel electrode 191b includes a second transverse stem part 192b extending in the first direction DR1, the second longitudinal stem part 193b crossing the second transverse stem part 192b and extending in the second direction DR2, and a plurality of second minute branch parts 194b extending from the second transverse stem part 192b and the second longitudinal stem part 193b in the diagonal direction. The electrode is removed between the adjacent second minute branch parts 194b such that the minute slit is formed.

The acute angle formed between the second minute branch parts 194b and the second transverse stem part 192b or the second longitudinal stem part 193b may be about 40° to 45°. The size(s) of the angle(s) may be appropriately configured in consideration of display characteristics such as visibility and the like of the liquid crystal display.

The second sub-pixel electrode 191b includes the wide region in which the part of the second minute branch parts 194b is elongated, and may be connected to the second expansion part 177b of the second drain electrode 175b through the wide region.

Shielding electrodes 199a and 199b are separated from the first and second sub-pixel electrodes 191a and 191b and disposed to substantially extend in the first direction DR1. The shielding electrodes 199a and 199b may be formed on the same layer as the pixel electrode 191, and may be made of the same material as the pixel electrode 191.

The shielding electrodes 199a and 199b receive the same voltage as the common electrode (not shown). The electric field is not generated between the shielding electrodes 199a and 199b and the common electrode, and the liquid crystal molecules are not rearranged. The liquid crystal between the shielding electrodes 199a and 199b and the common electrode 270 is in the black state. As such, when the liquid crystal molecules display black, the liquid crystal molecules themselves may serve as a light blocking member.

An upper substrate including an alignment layer, a common electrode, a light blocking member, etc. may be disposed on the pixel electrode 191.

A liquid crystal layer may be disposed between the lower substrate including the pixel electrode 191 and the upper substrate. The liquid crystal layer may include the liquid crystal molecules having negative dielectric anisotropy.

As the pixel electrode 191 to which the data voltage is applied generates the electric field along with the common electrode of the upper substrate, the arrangement direction of the liquid crystal molecules of the liquid crystal layer disposed between two electrodes may be determined. Depending on the directions of the liquid crystal molecules determined as such, luminance of light passing through the liquid crystal layer may be controlled.

The data voltage is only applied to the pixel electrode 191, however if the short circuit is generated in the overlapping region where the data line 171 and the storage electrode line 131 are crossed, the common voltage signal and the data signal are mixed such that the correct data signal may not be applied.

In an embodiment, at the position where a data line 171a or 171b and the first storage electrode line 131 overlap each other, a correct data signal may be applied to the pixel electrode 191 by cutting the first storage electrode line 131. Unwanted effects of the cuts may be repaired through a repair process.

FIG. 10 is a top plan view illustrating one pixel of a liquid crystal display after a repair process according to an embodiment.

Referring to FIG. 10, at the position X where an unwanted short circuit is formed due to the overlapping of the first data line 171a and the transverse part 131a of the first storage electrode line 131, portions C of the transverse part 131a of the first storage electrode line 131 near the overlap with the first data line 171a may be cut. If the shorted part X is cut from the transverse part 131a, the first data line 171a may receive a correct data signal.

However, if parts of the storage electrode line 131 are cut, the common voltage is not applied to regions including the expansion part 131c (connected to the transverse part 131a of the storage electrode line 131), the longitudinal parts 131b and 131d (connected to the expansion part 131c), etc.

If parts of the first storage electrode line 131 are cut, to solve the above-mentioned problem of insufficient common voltage supply, the repair patterns 170a and 170b (disposed throughout the first storage electrode line 131 of the first sub-pixel electrode 191a and the second storage electrode line 132 of the second sub-pixel electrode 191b) may be used.

In the repair process, a laser is irradiated to one end S of each of the repair patterns 170a and 170b and the transverse part 131a of the first storage electrode line 131 in the first sub-pixel electrode 191a, and a laser is irradiated to the other end S of each of the repair patterns 170a and 170b and a corresponding longitudinal part 132b of the second storage electrode line 132 in the second sub-pixel electrode 191b. One end S of each of the repair patterns 170a and 170b and the transverse part 131a of the first storage electrode line 131 are connected through a contact hole (corresponding to the end S) generated in the gate insulating layer 140, and the other end S of each of the repair patterns 170a and 170b and the longitudinal part 132b of the second storage electrode line 132 are connected through a contact hole (corresponding to the end S) generated in the gate insulating layer 140.

Therefore, even if parts of the first and second storage electrode lines 131 and 132 of the pixel are cut to remedy the unwanted short circuit, the common voltage may be sufficiently applied to the storage electrode line 131 of the other pixel by the repair patterns 170a and 170b.

Since it is not necessary to maintain an upper transverse part of the second storage electrode line 132, the region where the data lines 171a and 171b overlap the first and second storage electrode line 131 and 132 may be reduced.

In general, in the pixel area, a data load is generated in the overlapping region of the data lines 171a and 171b and the first and second storage electrode lines 131 and 132. The data load may cause a processing speed to be undesirably slow.

In the liquid crystal display according to an embodiment, the repair patterns 170a and 170b are implemented instead of extra structures of the first and second storage electrode lines 131 and 132. As a result, the overlapping region of the first and second storage electrode lines 131 and 132 and the data lines 171a and 171b may be minimized, such that the data load may be minimized. Advantageously, a charge ratio of the display device may be optimized.

While example embodiments have been described, practical embodiments are not limited to the described embodiments. Practical embodiments cover various modifications and equivalent arrangements within the scope of the appended claims.

What is claimed is:

1. A liquid crystal display device comprising:
a gate line configured to transmit a gate signal;
a first data line crossing the gate line and configured to transmit a first data signal;
a first storage electrode set;
a first thin film transistor comprising a first gate electrode, a first source electrode, a first drain electrode, and a first semiconductor member, wherein the first gate electrode is electrically connected to the gate line, wherein the first source electrode is electrically connected to the first data line, wherein the first drain electrode has an expansion part, and wherein the expansion part of the first drain electrode and a first expansion part of the first storage electrode set overlap each other and form a storage capacitor;
a first pixel electrode electrically connected to the first drain electrode and comprising a protrusion, wherein the protrusion directly contacts the expansion part of the first drain electrode and overlaps the first expansion part of the first storage electrode set; and
a first repair member formed of an electrically conductive material, electrically insulated from each of the first drain electrode, the first data line, and the first storage electrode set, and overlapping a second part of the first storage electrode set.

2. The liquid crystal display device of claim 1, wherein the first repair member is parallel to the first data line in a plan view of the liquid crystal display device.

3. The liquid crystal display device of claim 1, wherein the first semiconductor member overlaps each of the first gate electrode, the first source electrode, and the first drain electrode.

4. The liquid crystal display device of claim 1, further comprising a gate insulating layer disposed on the gate line and the first storage electrode set,
wherein the gate insulating layer electrically insulates each of the gate line and the first storage electrode set from each of the first data line and the first repair member.

5. The liquid crystal display device of claim 4,
wherein a face of the gate line is coplanar with a face of the first storage electrode set, and
wherein the first storage electrode set includes a first storage electrode part extending parallel to the gate line in the plan view of the liquid crystal display device.

6. The liquid crystal display device of claim 5, further comprising:
a second pixel electrode immediately neighboring the first pixel electrode with no intervening pixel electrode disposed between the first pixel electrode and the second pixel electrode; and
a second storage electrode set overlapping the second pixel electrode,
wherein a first end of the first repair member overlaps the first storage electrode part, and
wherein a second end of the first repair member overlaps the second storage electrode set.

7. The liquid crystal display device of claim 6,
wherein the first end of the first repair member is connected to the first storage electrode part through a first contact hole of the gate insulating layer, and
wherein the second end of the first repair member is connected to the second storage electrode set through a second contact hole of the gate insulating layer.

8. The liquid crystal display device of claim 1, further comprising a reference voltage line overlapping the first pixel electrode and configured to transmit a reference voltage,
wherein the repair member crosses the gate line and is parallel to a section of the reference voltage line in a plan view of the liquid crystal display device.

9. The liquid crystal display device of claim 8, further comprising a second data line configured to transmit a second data signal and immediately neighboring the first data line with no intervening data line being disposed between the first data line and the second data line,
wherein the first repair member is disposed between the first data line and the second data line.

10. The liquid crystal display device of claim 8, further comprising a second thin film transistor electrically connected to each of the reference voltage line, the first thin film transistor, and the first pixel electrode.

11. The liquid crystal display device of claim 8, further comprising a gate insulating layer disposed on the gate line and the first storage electrode set,
wherein the gate insulating layer electrically insulates each of the gate line and the first storage electrode set from each of the first data line, the reference voltage line, and the first repair member.

12. The liquid crystal display device of claim 11,
wherein a face of the gate line is coplanar with a face of the storage electrode set, and
wherein the first storage electrode set includes a first storage electrode part extending parallel to the gate line in the plan view of the liquid crystal display device.

13. The liquid crystal display device of claim 12, further comprising:
a second pixel electrode immediately neighboring the first pixel electrode with no intervening pixel electrode being disposed between the first pixel electrode and the second pixel electrode; and a second storage electrode set overlapping the second pixel electrode, wherein a first end of the first repair member overlaps the first storage electrode part, and wherein a second end of the first repair member overlaps the second storage electrode set.

14. The liquid crystal display device of claim 13, wherein the first end of the first repair member is connected to the first storage electrode part through a first contact hole of the gate insulating layer, and wherein the second end of the first repair member is connected to the second storage electrode set through a second contact hole of the gate insulating layer.

15. A liquid crystal display device comprising:

a gate line configured to transmit a gate signal;

a first data line crossing the gate line and configured to transmit a first data signal;

a first storage electrode set;

a first thin film transistor comprising a first gate electrode, a first source electrode, a first drain electrode, and a first semiconductor member, wherein the first gate electrode is electrically connected to the gate line, wherein the first source electrode is electrically connected to the first data line, and wherein the first drain electrode and a first part of the first storage electrode set overlap each other and form a storage capacitor;

a first pixel electrode electrically connected to the first drain electrode; and a first repair member formed of an electrically conductive material, electrically insulated from each of the first drain electrode and the first data line, and overlapping a second part of the first storage electrode set, wherein the first storage electrode set includes a floating storage electrode crossing the first data line in a plan view of the liquid crystal display device, and wherein the first repair member is parallel to the gate line in the plan view of the liquid crystal display device and overlaps the floating storage electrode.

16. The liquid crystal display device of claim 15, wherein the first semiconductor member overlaps each of the first gate electrode, the first source electrode, and the first drain electrode.

17. The liquid crystal display device of claim 15, further comprising:

a shielding electrode formed of a same material as the first pixel electrode, electrically insulated from the first pixel electrode, and overlapping each of the first repair member and the first source electrode.

18. The liquid crystal display device of claim 15, further comprising a gate insulating layer disposed on the gate line and the first storage electrode set, wherein the gate insulating layer electrically insulates each of the gate line and the first storage electrode set from each of the first repair member and the first data line.

19. The liquid crystal display device of claim 18, wherein a face of the first storage electrode set is coplanar with a face of the gate line, and wherein the first storage electrode set includes a storage electrode part extending parallel to the gate line in the plan view of the liquid crystal display device.

20. The liquid crystal display device of claim 19, wherein the first repair member is connected to the floating storage electrode through a contact hole of the gate insulating layer.

21. A liquid crystal display device comprising:

a gate line configured to transmit a gate signal;

a first data line crossing the gate line and configured to transmit a first data signal;

a first storage electrode set;

a first thin film transistor comprising a first gate electrode, a first source electrode, a first drain electrode, and a first semiconductor member, wherein the first gate electrode is electrically connected to the gate line, wherein the first source electrode is electrically connected to the first data line, and wherein the first drain electrode and a first expansion part of the first storage electrode set overlap each other and form a storage capacitor;

a first pixel electrode electrically connected to the first drain electrode;

a first repair member formed of an electrically conductive material, electrically insulated from each of the first drain electrode, the first data line, and the first storage electrode set, and overlapping a second part of the first storage electrode set; and a shielding electrode formed of a same material as the first pixel electrode, electrically insulated from the first pixel electrode, and overlapping each of the first repair member and the first source electrode.

* * * * *